(12) United States Patent
Takahashi et al.

(10) Patent No.: US 7,737,426 B2
(45) Date of Patent: Jun. 15, 2010

(54) SUBSTRATE POSITIONING DEVICE AND SUBSTRATE POSITIONING METHOD FOR A SUBSTRATE HAVING A TRANSPARENT LAYER AND A NONTRANSPARENT LAYER

(75) Inventors: Hiroyuki Takahashi, Yamanashi (JP); Chikara Tokida, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 179 days.

(21) Appl. No.: 11/965,928

(22) Filed: Dec. 28, 2007

(65) Prior Publication Data

US 2008/0181752 A1    Jul. 31, 2008

Related U.S. Application Data

(60) Provisional application No. 60/907,397, filed on Mar. 30, 2007.

(30) Foreign Application Priority Data

Jan. 31, 2007    (JP) ............................. 2007-022363

(51) Int. Cl.
*G01N 21/86* (2006.01)
*G01N 21/00* (2006.01)

(52) U.S. Cl. ................................ 250/559.36; 356/237.4

(58) Field of Classification Search .............. 250/559.3, 250/559.36; 356/237.4–237.6, 614; 414/935, 414/936; 700/213; 382/145
See application file for complete search history.

(56) References Cited

U.S. PATENT DOCUMENTS 5,781,230 A * 7/1998 Nguyen et al. ............... 348/128
6,071,796 A * 6/2000 Voutsas ....................... 438/487

FOREIGN PATENT DOCUMENTS

| JP | 6-45226 | 2/1994 |
| JP | 7-326665 | 12/1995 |
| JP | 10-199809 | 7/1998 |
| JP | 2006-19388 | 1/2006 |

* cited by examiner

*Primary Examiner*—Thanh X Luu
(74) *Attorney, Agent, or Firm*—Oblon, Spivak, McClelland, Maier & Neustadt, L.L.P.

(57) ABSTRACT

It is intended to achieve a high level of positioning accuracy for a substrate assuming a two-layer structure constituted with a transparent layer with a high level of light transmissivity and a nontransparent layer with a low level of light transmissivity. A substrate positioning device according to the present invention characterized in that only the edge of the nontransparent layer, not the edge of the transparent layer, is exclusively detected and the substrate is positioned based upon the detection results.

10 Claims, 7 Drawing Sheets

SUBSTRATE POSITIONING DEVICE AND SUBSTRATE POSITIONING METHOD FOR A SUBSTRATE HAVING A TRANSPARENT LAYER AND A NONTRANSPARENT LAYER

CROSS-REFERENCE TO RELATED APPLICATIONS

This document claims priority to Japanese Patent Application Number 2007-022363, filed on Jan. 31, 2007 and U.S. Provisional Application No. 60/907,397, filed on Mar. 30, 2007, the entire content of which are hereby incorporated by reference.

FIELD OF THE INVENTION

The present invention relates to a substrate positioning device and a substrate positioning method to be adopted to position a substrate.

BACKGROUND OF THE INVENTION

In a substrate processing apparatus, a substrate undergoing processing for semiconductor device production, such as a wafer, is carried into a processing chamber via a transfer means such as a transfer arm and a specific type of processing, e.g., etching or film formation, is executed on the wafer having been carried into the processing chamber. As increasingly fine circuit patterns have come to be formed through highly advanced micro-processing technologies in recent years, it has become necessary to position the wafer undergoing processing or inspection with a high level of positioning accuracy in correspondence to the nano-order device design specifications (e.g., circuit line width of 65 nm).

The wafer is usually positioned by, for instance, disposing a light emitting unit and a light receiving unit of a light-transmitting sensor so as to allow them to operate across the wafer edge, through which light radiated toward the wafer edge is transmitted and received as the wafer is rotated, obtaining data indicating the wafer edge shape based upon a change in the quantity of the transmitted light and detecting the direction and extent of misalignment of the wafer center relative to a specific position based upon the data thus obtained. The wafer center can be positioned based upon the detection results.

A notch mark, such as an indented notch or a linear notch, often referred to as an orientation flat, is formed at part of the edge of the wafer. As light is radiated onto the edge area of the rotating wafer, as described above, a relatively significant change occurs in the quantity of light transmitted over the notch mark. Accordingly, the presence of the notch mark is reflected in the wafer edge shape data, enabling accurate detection of the notch mark position. As a result, the wafer can be positioned along the circumferential direction based upon the circumferential shape of the wafer.

The wafer, having been accurately centered and positioned along the circumferential direction as described above, is then transferred to take a specific position inside the processing chamber with a high level of accuracy via a transfer means in the state in which its angle assumed along the circumferential direction has been adjusted.

Various technologies have been proposed to date in the area of wafer positioning. For instance, Japanese Laid Open Patent Publication No. H06-045226 (patent reference literature 1) discloses a positioning device that includes at least three linear sensors engaged in operation to set a wafer at a specific position and orient it in a specific direction accurately and quickly. Japanese Laid Open Patent Publication No. 2006-019388 (patent reference literature 2) discloses a technology that enables wafer positioning even when a wafer edge over which a notch is formed cannot be detected.

Wafers used in semiconductor device production include those constituted of sapphire glass, quartz glass and the like with superior light transmission characteristics and electrical insulation characteristics (hereafter referred to as "glass wafers"), as well as wafers constituted of a single-crystal silicon (hereafter referred to as "silicon wafers"). The linear advance of light perpendicular to the surface of such a glass wafer may be disallowed by beveling its entire edge, so as to enable detection of the beveled edge with a light transmitting sensor. Based upon the results of the edge detection, the glass wafer can be positioned accurately.

As disclosed in Japanese Laid Open Patent Publication No. H07-326665 (patent reference literature 3), we have seen the advent of two-layer composite wafers formed by layering the glass wafer and the silicon wafer described above one on top of the other. In addition, Japanese Laid Open Patent Publication No. H10-199809 (patent reference literature 4) above discloses a method for forming an amorphous silicon film over the surface of a glass substrate.

A composite wafer normally adopts a structure achieved by superposing a transparent wafer (transparent layer) with a high level of light transmissivity such as a glass wafer and a nontransparent wafer (nontransparent layer) such as a silicon wafer with low light transmissivity allowing hardly any light to be transmitted through, which assumes smaller external dimensions than the transparent wafer, one on top of the other with the entire edge of the transparent wafer extending beyond the edge of the nontransparent wafer.

The edge of the transparent wafer, equivalent to the outermost periphery of this composite wafer, will normally be beveled over the entire periphery. Accordingly, in edge shape data obtained by using a light transmitting sensor while rotating the composite wafer along the peripheral direction, theoretically, the edge of the transparent wafer should be detected as the edge of the composite wafer, since light does not advance linearly at the outermost edge of the transparent wafer.

However, depending upon the rotational angle, the edge of the transparent wafer is not always detected, due to, for instance, irregular reflection. If the edge of the transparent wafer is not detected, edge detection is executed inward and, as a result, the edge of the nontransparent wafer located further inward relative to the edge of the transparent wafer is detected as the edge of the composite wafer. In other words, there is a problem to be addressed in that depending upon the rotational angle, the edge of the transparent wafer or the edge of the nontransparent wafer may be detected as the edge of a composite wafer such as that described above and since valid edge shape data representing the edge of the composite wafer cannot be obtained, the wafer cannot be positioned accurately.

In particular, in the case of a composite wafer with a notch mark formed only at the edge of the nontransparent wafer, the notch mark cannot be detected if the edge of the transparent wafer is detected as the edge of the composite wafer, leading to a concern that the composite wafer cannot be positioned at all based upon the notch mark.

SUMMARY OF THE INVENTION

Accordingly, an object of the present invention, having been completed by addressing the issues discussed above, is to provide a substrate positioning device and a substrate positioning method with which a substrate assuming a two-layer structure with a transparent layer achieving a high level of light transmissivity and a nontransparent layer with a low level of light transmissivity, which assumes smaller external dimensions than the transparent layer, superposed one on top of the other so that the entire edge of the transparent layer extends beyond the edge of the nontransparent layer, can be positioned with high accuracy by ensuring that the edge of the transparent layer is not detected as the edge of the substrate.

The object described above is achieved in an aspect of the present invention by providing a substrate positioning device that positions a substrate assuming a two-layer structure constituted with a transparent layer achieving a high level of light transmissivity and a nontransparent layer with a low level of light transmissivity, which assumes smaller external dimensions than the transparent layer, superposed one on top of the other so that the edge of the transparent layer extends along the entire periphery beyond the edge of the nontransparent layer, characterized in that only the edge of the nontransparent layer, not the edge of the transparent layer, is detected and that the substrate is positioned based upon the detection results.

The present invention also provides a substrate positioning method to be adopted in a substrate positioning device to position a substrate assuming a two-layer structure constituted with a transparent layer achieving a high level of light transmissivity and a nontransparent layer with a low level of light transmissivity, which assumes smaller external dimensions than the transparent layer, superposed one on top of the other so that the edge of the transparent layer extends along the entire periphery beyond the edge of the nontransparent layer, characterized in that only the edge of the nontransparent layer, not the edge of the transparent layer, is detected and that the substrate is positioned based upon the detection results.

According to the invention described above, data indicating the edge shape of the substrate can be obtained entirely based upon the edge shape of the nontransparent substrate. Consequently, the shape assumed by the substrate along its edge can be ascertained with high accuracy and ultimately, the substrate can be positioned with a high level of accuracy.

In addition, a notch mark formed at the edge of the nontransparent layer may be detected based upon the shape of the edge of the nontransparent layer ascertained by detecting the edge position of the nontransparent layer along the entire circumference of the substrate and based upon the notch mark thus detected, the substrate may be positioned. Ultimately, the substrate can be positioned accurately along the circumferential direction as well.

The object described above is achieved in another aspect of the present invention by providing a substrate positioning device that positions a substrate assuming a two-layer structure constituted with a transparent layer achieving a high level of light transmissivity and a nontransparent layer with a low level of light transmissivity, which assumes smaller external dimensions than the transparent layer, superposed one on top of the other so that the edge of the transparent layer extends along the entire periphery beyond the edge of the nontransparent layer, comprising a stage on which the substrate is placed; a light emitting means for emitting light toward the substrate on the stage by directing the light toward an edge of the substrate including the edge of the transparent layer and the edge of the nontransparent layer, a light-receiving means disposed to face opposite the light emitting means with the substrate set in between, which includes a plurality of light-receiving pixels linearly arrayed from a point further outside relative to the edge of the substrate toward a point further inside relative to the edge of the substrate and outputs signals each corresponding to the intensity of light received at one of the light-receiving pixels; and a control unit that compares the signals output from the light-receiving means with a preset threshold value indicating a cut-off point between a light transmission level and a light blocking level to determine whether the output signal from each light-receiving pixel indicates the light transmission level or the light blocking level, then detects a boundary at which a changeover from the light transmission level to the light blocking level occurs along a forward direction in the array of the sequentially disposed light-receiving pixels, detects a position of a light-receiving pixel present at a boundary as an edge position of the substrate only if the light blocking level following the changeover is judged to be sustained over a number of light-receiving pixels equal to or greater than a distance between the edge of the transparent layer and the edge of the nontransparent layer and positions the substrate based upon an edge shape of the substrate ascertained by detecting the substrate edge position over the entire periphery of the substrate.

The present invention also provides a substrate positioning method to be adopted in a substrate positioning device to position a substrate assuming a two-layer structure constituted with a transparent layer achieving a high level of light transmissivity and a nontransparent layer with a low level of light transmissivity, which assumes smaller external dimensions than the transparent layer, superposed one on top of the other so that the edge of the transparent layer extends along the entire periphery beyond the edge of the nontransparent layer. The substrate positioning device comprises: a stage on which the substrate is placed; a light emitting means for emitting light toward the substrate on the stage by directing the light toward an edge of the substrate including the edge of the transparent layer and the edge of the nontransparent layer; and a light-receiving means disposed to face opposite the light emitting means with the substrate set in between, which includes a plurality of light-receiving pixels linearly arrayed from a point further outside relative to the edge of the substrate toward a point further inside relative to the edge of the substrate and outputs signals each corresponding to the intensity of light received at one of the light-receiving pixels. The substrate positioning method is characterized in that the signals output from the light-receiving means are compared with a preset threshold value indicating ca cut-off point between a light transmission level and a light blocking level to determine whether the output signal from each light-receiving pixel indicates the light transmission level or the light blocking level, a boundary at which a changeover from the light transmission level to the light blocking level occurs along a forward direction in the array of the sequentially disposed light-receiving pixels is detected, the position of a light-receiving pixel present at a boundary is detected as an edge position of the substrate only if the light blocking level following the changeover is judged to be sustained over a number of light-receiving pixels equal to or greater than a distance between the edge of the transparent layer and the edge of the nontransparent layer and positions the substrate is positioned based upon an edge shape of the substrate ascertained by detecting the substrate edge position over the entire periphery of the substrate.

According to the present invention described above, when light emitted from the light emitting means is blocked at the edge of the transparent layer and the signal output from a light-receiving pixel at the light-receiving means assuming a position corresponding to the edge of the transparent layer is judged to indicate the light blocking level, only the edge of the nontransparent layer is detected as the edge of the substrate without detecting the edge of the transparent layer. As a result, valid edge shape data accurately indicating the shape of the edge of the substrate can be obtained and, based upon the data, the substrate can be positioned with a high level of accuracy.

A value at which the signal output from a light-receiving pixel having received light transmitted through the edge of the transparent layer (signal corresponding to the intensity of the light having been received at the light-receiving pixel) is judged to indicate the light transmission level may be selected in advance as the threshold value. For instance, the threshold value may be set to a value between the level of a signal output from a light-receiving pixel corresponding to the edge of the transparent layer and the level of a signal output from a light-receiving pixel corresponding to an area where the nontransparent layer is present. In this case, a received light intensity level lower than the threshold value will be judged to be a nontransparent level and a received light intensity level higher than the threshold value will be judged to be a transparent level. As a result, a signal corresponding to the intensity of light transmitted through the edge of the transparent layer and reaching the light-receiving means, indicating a received light intensity level higher than the threshold value, is invariably judged to indicate the light transmission level and thus, the edge of the transparent layer is never detected as the edge of the substrate. Ultimately, the edge of the nontransparent layer alone is detected as the edge of the substrate.

The object described above is achieved in another aspect of the present invention by providing a substrate positioning device that positions a substrate assuming a two-layer structure constituted with a transparent layer achieving a high level of light transmissivity and a nontransparent layer with a low level of light transmissivity, which assumes smaller external dimensions than the transparent layer, superposed one on top of the other so that the edge of the transparent layer extends along the entire periphery beyond the edge of the nontransparent layer, comprising: a stage on which the substrate is placed, a light emitting means for emitting light toward the substrate on the stage by directing the light toward an edge of the substrate including the edge of the transparent layer and the edge of the nontransparent layer; a light-receiving means disposed to face opposite the light emitting means with the substrate set in between, which includes a plurality of light-receiving pixels linearly arrayed from a point further outside relative to the edge of the substrate toward a point further inside relative to the edge of the substrate and outputs signals each corresponding to the intensity of light received at one of the light-receiving pixels; and a control unit that compares the signals output from the light-receiving means with a preset threshold value assuming a value at which a signal output from a light-receiving pixel having received light having been transmitted through the edge of the transparent layer is judged to indicate a light transmission level to determine whether the output signal from each light-receiving pixel indicates the light transmission level or a light blocking level, then detects a position of the light-receiving pixel present at a boundary at which a changeover from the light transmission level to the light blocking level occurs along a forward direction in the array of the sequentially disposed light-receiving pixels as an edge position of the substrate and positions the substrate based upon an edge shape of the substrate ascertained by detecting the substrate edge position over the entire periphery of the substrate.

The present invention also provides a substrate positioning method to be adopted in a substrate positioning device to position a substrate assuming a two-layer structure constituted with a transparent layer achieving a high level of light transmissivity and a nontransparent layer with a low level of light transmissivity, which assumes smaller external dimensions than the transparent layer, superposed one on top of the other so that the edge of the transparent layer extends along the entire periphery beyond the edge of the nontransparent layer. The substrate positioning device comprises: a stage on which the substrate is placed, a light emitting means for emitting light toward the substrate on the stage by directing the light toward an edge of the substrate including the edge of the transparent layer and the edge of the nontransparent layer; and a light-receiving means disposed to face opposite the light emitting means with the substrate set in between, which includes a plurality of light-receiving pixels linearly arrayed from a point further outside relative to the edge of the substrate toward a point further inside relative to the edge of the substrate and outputs signals each corresponding to the intensity of light received at one of the light-receiving pixels. The substrate positioning method is characterized in that the signals output from the light-receiving means are compared with a preset threshold value assuming a value at which a signal output from a light-receiving pixel having received light transmitted through the edge of the transparent layer is judged to indicate a light transmission level to determine whether the output signal from each light-receiving pixel indicates either a light transmission level, or a light blocking level, a position of a light-receiving pixel present at a boundary at which a changeover from the light transmission level to the light blocking level occurs along a forward direction in the array of the sequentially disposed light-receiving pixels is detected, as an edge position of the substrate and the substrate is positioned based upon an edge shape of the substrate ascertained by detecting the substrate edge position over the entire periphery of the substrate.

According to the present invention described above, a signal corresponding to the intensity of light transmitted through the edge of the transparent layer and reaching the light-receiving means is invariably judged to indicate the light transmission level and, as a result, the edge of the transparent layer is never detected as the edge of the substrate. In other words, the edge of the nontransparent layer alone is detected as the edge of the substrate. As a result, valid edge shape data accurately indicating the shape of the edge of the substrate can be obtained and, based upon the data, the substrate can be positioned with a high level of accuracy.

The object described above is achieved in another aspect of the present invention by providing a substrate positioning device that positions a substrate assuming a two-layer structure constituted with a transparent layer achieving a high level of light transmissivity and a nontransparent layer with a low level of light transmissivity, which assumes smaller external dimensions than the transparent layer, superposed one on top of the other so that the edge of the transparent layer extends along the entire periphery beyond the edge of the nontransparent layer, comprising: a stage on which the substrate is placed, a light emitting means for emitting light toward the substrate on the stage by directing light toward an edge of the substrate including the edge of the transparent layer and the edge of the nontransparent layer; a light-receiving means disposed to face opposite the light emitting means with the substrate set in between, which includes a plurality of light-receiving pixels linearly arrayed from a point further outside relative to the edge of the substrate toward a point further inside relative to the edge of the substrate and outputs signals each corresponding to the intensity of light received at one of the light-receiving pixels; and a control unit that compares the signals output from the light-receiving means with a preset threshold value indicating a cut-off point between a light transmission level and a light blocking level to determine whether the output signal from each light-receiving pixel indicates the light transmission level or the light blocking level, then detects a second boundary at which a second changeover from the light transmission level to the light blocking level occurs along a forward direction in the array of the sequentially disposed light-receiving pixels, detects the position of a light-receiving pixel as an edge position of the substrate and positions the substrate based upon an edge shape of the substrate ascertained by detecting the substrate edge position over the entire periphery of the substrate.

The present invention also provides a substrate positioning method to be adopted in a substrate positioning device to position a substrate assuming a two-layer structure constituted with a transparent layer achieving a high level of light transmissivity and a nontransparent layer with a low level of light transmissivity, which assumes smaller external dimensions than the transparent layer, superposed one on top of the other so that the edge of the transparent layer extends along the entire periphery beyond the edge of the nontransparent layer. The substrate positioning device comprises: a stage on which the substrate is placed; a light emitting means for emitting light toward the substrate on the stage by directing light toward an edge of the substrate including the edge of the transparent layer and the edge of the nontransparent layer; and a light-receiving means disposed to face opposite the light emitting means with the substrate set in between, which includes a plurality of light-receiving pixels linearly arrayed from a point further outside relative to the edge of the substrate toward a point further inside relative to the edge of the substrate and outputs signals each corresponding to the intensity of light received at one of the light-receiving pixels. The substrate positioning method is characterized in that the signals output from the light-receiving means are compared with a preset threshold value indicating a cut-off point between a light transmission level and a light blocking level to determine whether the output signal from each light-receiving pixel indicates the light transmission level or the light blocking level, a position of a light-receiving pixel present at a second boundary at which a second changeover from the light transmission level to the light blocking level occurs along a forward direction in the array of the sequentially disposed light-receiving pixels as an edge position of the substrate and the substrate is positioned based upon an edge shape of the substrate ascertained by detecting the substrate edge position over the entire periphery of the substrate.

According to the invention described above, even when light emitted from the light emitting means is blocked at the edge of the transparent layer and the signal output from a light-receiving pixel at the light-receiving means assuming a position corresponding to the edge of the transparent layer is judged to indicate the light blocking level, this light blocking level is disregarded during the substrate edge position detection and instead, the boundary of a light-receiving pixel at which the light blocking level is detected for the second time along the forward direction in the array of the sequentially disposed light-receiving pixels and an immediately preceding light-receiving pixel indicating the light transmission level is detected. Namely, the edge of the nontransparent layer corresponding to the second boundary alone is detected as the edge of the substrate without detecting the edge of the transparent layer. As a result, valid edge shape data accurately indicating the shape of the edge of the substrate can be obtained and, based upon the data, the substrate can be positioned with a high level of accuracy.

The object described above is achieved in another aspect of the present invention by providing a substrate positioning device that positions a substrate assuming a two-layer structure constituted with a transparent layer achieving a high level of light transmissivity and a nontransparent layer with a low level of light transmissivity, which assumes smaller external dimensions than the transparent layer, superposed one on top of the other so that the edge of the transparent layer extends along the entire periphery beyond the edge of the nontransparent layer, comprising: a stage on which the substrate is placed, a light emitting means for emitting light toward the substrate on the stage by directing the light toward an edge of the substrate including the edge of the transparent layer and the edge of the nontransparent layer on the stage; a light-receiving means disposed to face opposite the light emitting means with the substrate set in between, which includes a plurality of light-receiving pixels linearly arrayed from a point further outside relative to the edge of the substrate toward a point further inside relative to the edge of the substrate and outputs signals each corresponding to the intensity of light received at one of the light-receiving pixels; and a control unit that compares the signals output from the light-receiving means with a preset threshold value indicating a cut-off point between a light transmission level and a light blocking level to determine whether the output signal from each light-receiving pixel indicates the light transmission level or the light blocking level, then detects a first light-receiving pixel present at a first boundary at which a first changeover from the light blocking level to the light transmission level occurs along a reverse direction in the array of the sequentially disposed light-receiving pixels, as an edge position of the substrate and positions the substrate based upon an edge shape of the substrate ascertained by detecting the substrate edge position over the entire periphery of the substrate.

The present invention also provides a substrate positioning method to be adopted in a substrate positioning device to position a substrate assuming a two-layer structure constituted with a transparent layer achieving a high level of light transmissivity and a nontransparent layer with a low level of light transmissivity, which assumes smaller external dimensions than the transparent layer, superposed one on top of the other so that the edge of the transparent layer extends along the entire periphery beyond the edge of the nontransparent layer. The substrate positioning device comprises: a stage on which the substrate is placed; a light emitting means for emitting light toward the substrate on the stage by directing the light toward an edge of the substrate including the edge of the transparent layer and the edge of the nontransparent layer; and a light-receiving means disposed to face opposite the light emitting means with the substrate set in between, which includes a plurality of light-receiving pixels linearly arrayed from a point further outside relative to the edge of the substrate toward a point further inside relative to the edge of the substrate and outputs signals each corresponding to the intensity of light received at one of the light-receiving pixels. The substrate positioning method is characterized in that the signals output from the light-receiving means are compared with a preset threshold value indicating a cut-off point between a light transmission level and a light blocking level to determine whether the output signal from each light-receiving pixel indicates the light transmission level or the light blocking level, a position of a light-receiving pixel at a first boundary at which a first changeover from the light blocking level to the light transmission level occurs along a reverse direction in the array of the sequentially disposed light-receiving pixels is detected as an edge of the substrate and the substrate is positioned based upon an edge shape of the substrate ascertained by detecting the substrate edge position over the entire periphery of the substrate.

According to the invention described above, even when light emitted from the light emitting means is blocked at the edge of the transparent layer and the signal output from a light-receiving pixel at the light-receiving means assuming a position corresponding to the edge of the transparent layer is judged to indicate the light blocking level, the boundary of a first light-receiving pixel indicating the light blocking level and an immediately following light-receiving pixel indicating the light transmission level along the reverse direction in the array of the sequentially disposed light-receiving pixels is first detected before the light blocking level is detected during the substrate edge position detection. Namely, the edge of the nontransparent layer alone is detected as the edge of the substrate without detecting the edge of the transparent layer. As a result, valid edge shape data accurately indicating the shape of the edge of the substrate can be obtained and, based upon the data, the substrate can be positioned with a high level of accuracy.

The object described above is achieved in another aspect of the present invention by providing a substrate positioning device that positions a substrate assuming a two-layer structure constituted with a substantially round transparent substrate achieving a high level of light transmissivity and a substantially round nontransparent substrate with a low level of light transmissivity, which assumes smaller external dimensions than the transparent substrate, superposed one on top of the other so that the edge of the transparent substrate extends along the entire periphery beyond the edge of the nontransparent substrate, comprising: a rotary stage on which the substrate is placed; a light emitting means for emitting light toward the substrate on the rotatably stage by directing the light toward an edge of the substrate including the edge of the transparent substrate and the edge of the nontransparent substrate; a light-receiving means disposed to face opposite the light emitting means with the substrate set in between, which includes a plurality of light-receiving pixels linearly arrayed from a point further outside relative to the edge of the substrate toward a point further inside relative to the edge of the substrate and outputs signals each corresponding to the intensity of light received at one of the light-receiving pixels; and a control unit that compares the signals output from the light-receiving means with a preset threshold value assuming a value at which a signal output from a light-receiving pixel having received light transmitted through the edge of the transparent substrate is judged to indicate a light transmission level to determine whether the output signal from each light-receiving pixel indicates the light transmission level or a light blocking level, then detects a boundary at which a changeover from the light transmission level to the light blocking level occurs along a forward direction in the array of the sequentially disposed light-receiving pixels, detects the position of a light-receiving pixel present at the boundary as an edge position of the substrate only if the light blocking level following the changeover is judged to be sustained over a number of light-receiving pixels equal to or greater than a distance between the edge of the transparent substrate and the edge of the nontransparent substrate and positions the substrate based upon a edge shape of the substrate ascertained by detecting the substrate edge position over the entire circumference of the substrate while rotating the substrate via the rotary stage.

According to the present invention described above, when light emitted from the light emitting means is blocked at the edge of the transparent substrate and the signal output from a light-receiving pixel at the light-receiving means assuming a position corresponding to the edge of the transparent substrate is judged to indicate the light blocking level, only the edge of the nontransparent substrate is detected as the edge of the substrate without detecting the edge of the transparent substrate. As a result, valid edge shape data accurately indicating the shape of the edge of the substrate can be obtained and, based upon the data, the substrate can be positioned with a high level of accuracy.

According to the present invention, the substrate, which may include the transparent substrate constituted with a glass substrate and the nontransparent substrate constituted with a silicon substrate, can be positioned with a high level of accuracy.

The control unit may detect a notch mark formed at the edge of the substrate based upon the shape of the substrate along its edge and then may position the substrate based upon the detected notch mark. In this case, the substrate can be positioned with a high level of accuracy along the circumferential direction as well.

According to the present invention, the edge of the nontransparent layer and a notch mark formed at the edge can be detected accurately without detecting the edge of the transparent layer as the edge of the substrate assuming a two-layer structure achieved by superposing the transparent layer with a high level of light transmissivity and the nontransparent layer with low light transmissivity, which assumes smaller external dimensions than the transparent layer one on top of the other so that the edge of the transparent layer extends over its entire periphery beyond the edge of the nontransparent layer. As a result, the substrate can be positioned with high accuracy.

DETAILED DESCRIPTION OF THE PREFERRED EMBODIMENTS

Figure 1:
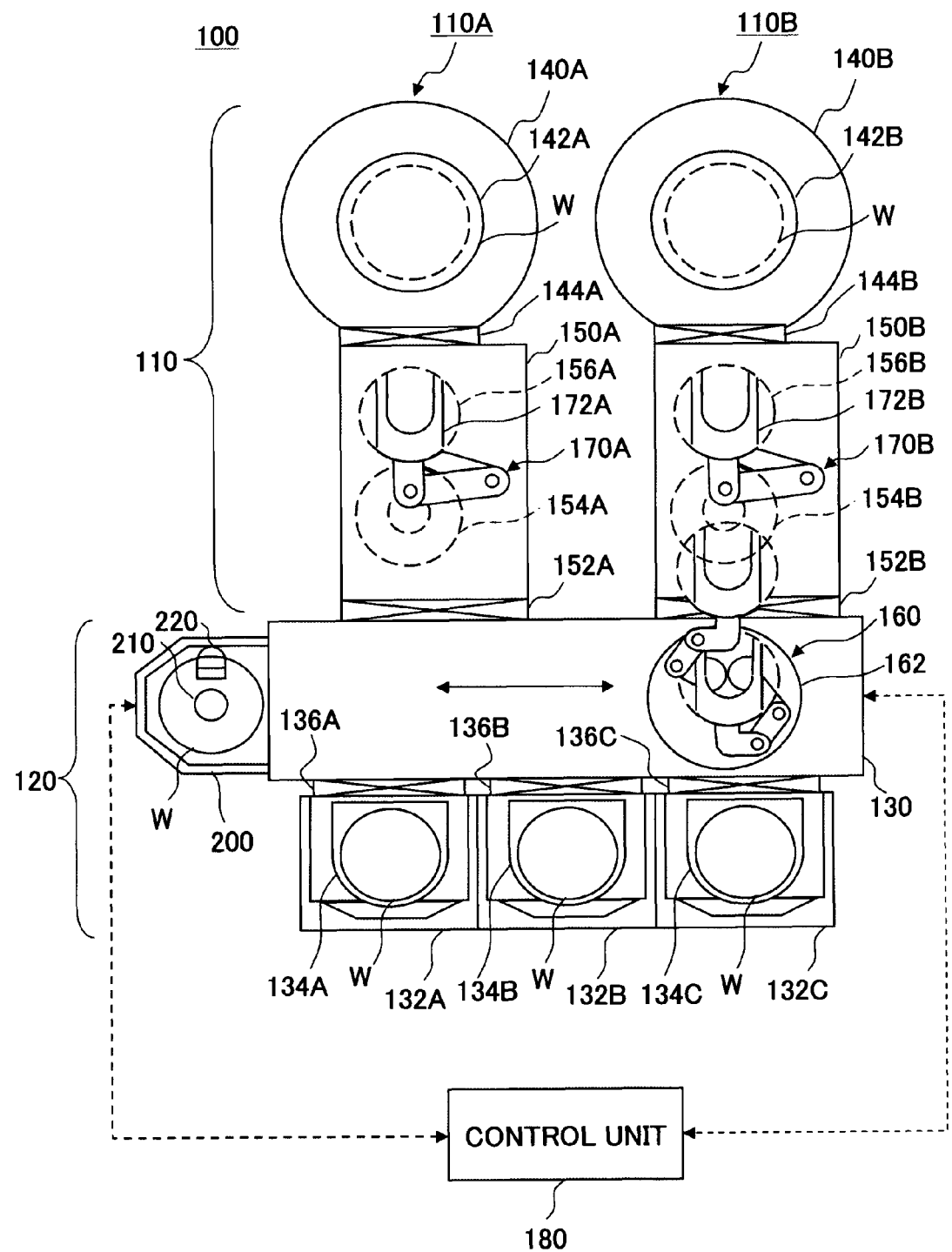
FIG. 1 is a sectional view presenting a structural example that may be adopted in the substrate processing apparatus in a first embodiment of the present invention.

The following is a detailed explanation of the preferred embodiments of the present invention, given in reference to the attached drawings. It is to be noted that in the specification and the drawings, the same reference numerals are assigned to components having substantially identical functions and structural features to preclude the necessity for a repeated explanation thereof.

Structural Example for the Substrate Processing Apparatus Achieved in the First Embodiment First, a structural example that may be adopted in the substrate processing apparatus in an embodiment of the present invention is explained in reference to a drawing. The substrate processing apparatus in this example includes at least one vacuum processing unit connected to a transfer chamber. FIG. 1 is a sectional view schematically illustrating the structure of the substrate processing apparatus achieved in the embodiment. The substrate processing apparatus 100 includes either a single vacuum processing unit 110 or a plurality of vacuum processing units 110 where various types of processing such as film formation and etching are executed on a processing target substrate, e.g., a wafer W, in order to manufacture a semiconductor device, and a transfer unit 120 that transfers the wafer W into/out of each vacuum processing unit 110. The transfer unit 120 includes a common transfer chamber 130 used when transferring wafers W.

In the example presented in FIG. 1, two vacuum processing units 110A and 110B are disposed along a side surface of the transfer unit 120. The vacuum processing units 110A and 110B respectively include processing chambers 140A and 140B and evacuatable load-lock chambers 150A and 150B disposed continuous to the corresponding processing chambers. In the processing chambers 140A and 140B of the vacuum processing units 110A and 110B, a single type of processing or different types of processing can be executed on wafers W. Inside the processing chambers 140A and 140B, stages 142A and 142B on which wafers W can be placed are disposed. It is to be noted that the number of vacuum processing units 110, each comprising a processing chamber 140 and a load-lock chamber 150, is not limited to two, and additional vacuum processing units may be disposed.

The transfer chamber 130 at the transfer unit 120 is formed as a box with a substantially rectangular section, where an inert gas such as $N_2$ gas or clean air is circulated. A plurality of cassette stages 132A through 132C are disposed side-by-side at one of the side surfaces of the transfer chamber 130 ranging along the longer side of the substantially rectangular section. The cassette stages 132A-132C function as substrate standby ports, at which cassette containers 134A through 134C are placed. While FIG. 1 shows three cassette containers 134A through 134C each placed on one of the cassette stages 132A through 132C, the numbers of the cassette stages and the cassette containers are not limited to this example and there may be one or two cassette stages and cassette containers, or there may be four or more cassette stages and cassette containers.

At each of the cassette containers 134A through 134C, up to 25 wafers W can be stored in multiple racks with equal pitches. The cassette containers assume a sealed structure with, for instance, an $N_2$ gas atmosphere filling the space therein. Wafers W can be carried into/out of the transfer chamber 130 via gate valves 136A through 136C.

A common transfer mechanism (atmospheric pressure-side transfer mechanism) 160 that transfers a wafer W along the longer side (along the direction indicated by the arrow in FIG. 1) thereof is disposed inside the transfer chamber 130. The common transfer mechanism 160 is fixed onto, for instance, a base 162 and the base 160 is allowed to slide on a guide rail (not shown) disposed over the central area of the transfer chamber 130 so as to extend along the longer side thereof via, for instance, a linear motor drive mechanism. The common transfer mechanism 160 may be a double-arm mechanism equipped with two end effectors, as shown in FIG. 1, or it may be a single-arm mechanism equipped with a single end effector.

At an end of the transfer chamber 130, i.e., at one side surface ranging along the shorter side of the substantially rectangular section, a positioning device (e.g., an orienter or a pre-alignment stage) 200 is disposed. The positioning device 200 positions (aligns) a wafer W. This positioning device 200 is to be described in detail later.

At the other side surface of the transfer chamber ranging along the longer side of the substantially rectangular section, the base ends of the two load-lock chambers 150A and 150B are connected via switchable gate valves (atmospheric pressure-side gate valves) 152A and 152B respectively. The front ends of the load-lock chambers 150A and 150B are respectively connected to the processing chambers 140A and 140B via switchable gate valves (vacuum pressure-side gate valves) 144A and 144B.

In the load-lock chambers 150A and 150B, a pair of buffer stages 154A and 156A and a pair of buffer stages 154B and 156B on which wafers W are temporarily held in standby are respectively disposed. In the explanation, the buffer stages 154A and 154B disposed closer to the transfer chamber are referred to as first buffer stages, whereas the buffer stages 156A and 156B disposed on the other side are referred to as second buffer stages. Individual transfer mechanisms (vacuum pressure-side transfer mechanisms) 170A and 170B, each constituted with an articulated arm capable of flexing, rotating and moving up/down, are disposed respectively between the buffer stages 154A and 156A and between the buffer stages 154B and 156B.

At the front ends of the individual transfer mechanisms 170A and 170B, end effectors 172A and 172B are respectively disposed, so that wafers W can be transferred between the first and second buffer stages 154A and 156A and between the first and second buffer stages 154B and 156B via the end effectors 172A and 172B respectively. It is to be noted that wafers are carried from the load-lock chambers 150A and 150B to the processing chambers 140A and 140B and vice versa via the respective individual transfer mechanisms 170A and 170B.

The substrate processing apparatus 100 includes a control unit 180 that controls the overall operations executed in the substrate processing apparatus, including operational control for the transfer mechanisms 160 and 170 and the gate valves 136, 144 and 152 as well as the positioning device 200. The control unit 180 includes a microcomputer constituting the main body of the control unit 180, a memory in which various types of data are stored and the like. It is to be noted that functions fulfilled in the control unit 180, which are related to wafer positioning processing, may instead be built into the positioning device 200 in the first embodiment.

When executing wafer processing in the substrate processing apparatus structured as described above, a wafer W taken out of a given cassette container among the cassette containers 134A through 134C by the common transfer mechanism 160 is first carried into the positioning device 200 where it is positioned (aligned). Then, the wafer W is transferred back to the common transfer mechanism 160 which carries it into the load-lock chamber 150A or 150B of the vacuum processing unit 110A or 110B where it is to undergo the processing. The wafer W is carried into the processing chamber 140A or 140B on the individual transfer mechanism 170A or 170B, and once in the processing chamber 140A or 140B, the wafer W undergoes a specific type of processing such as etching executed by using a processing gas. When the processing in the processing chamber 140A or 140B ends, the processed wafer W is taken back to the load-lock chamber 150A or 150B by an individual transfer mechanism 170A or 170B, and then it is carried back into the cassette container among the cassette containers 134A through 134C by the common transfer mechanism 160 via the transfer chamber 130.

Figure 2:
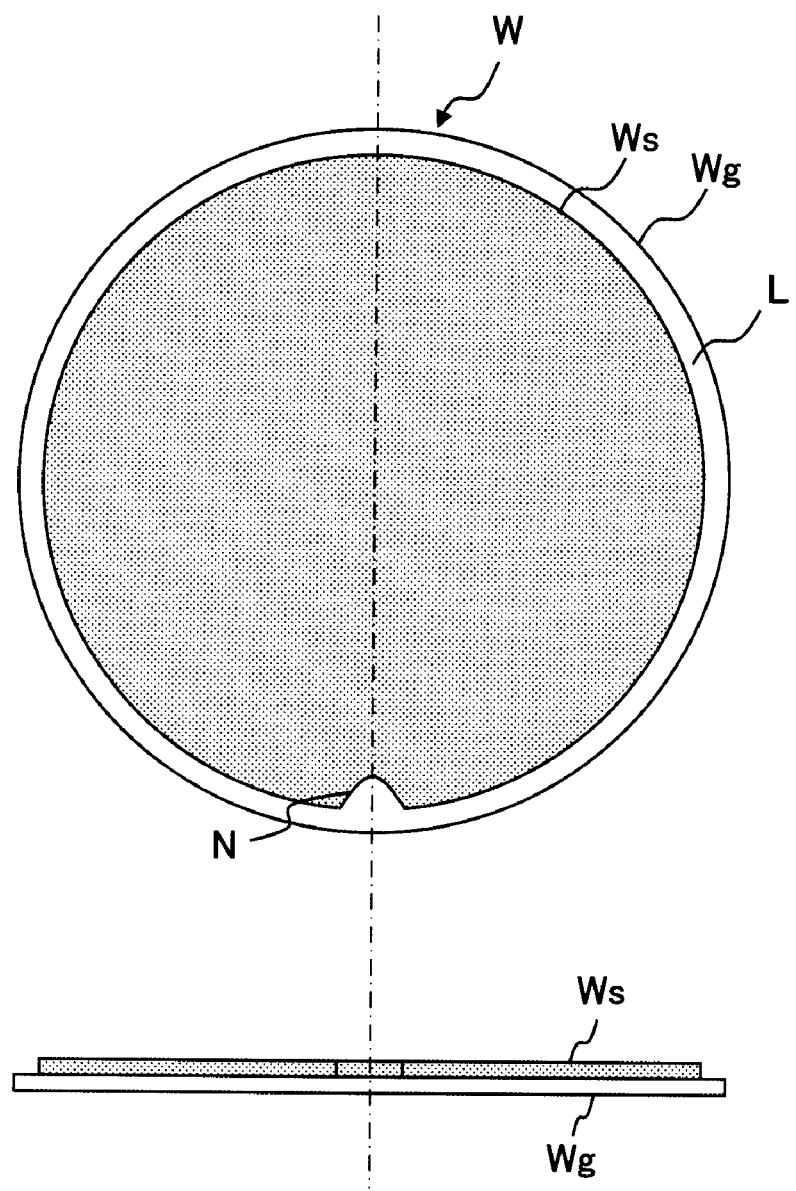
FIG. 2 presents a structural example that may be adopted in wafers used in the embodiment.

Structure of Wafers Processed in the Substrate Processing Apparatus in the Embodiment Next, the structure of wafers W processed in the substrate processing apparatus 100 achieved in the embodiment is explained in reference to a drawing. FIG. 2 presents an example of a structure that may be assumed for the wafers W in the embodiment. As shown in FIG. 2, the wafer W is formed by bonding a silicon wafer Ws onto the surface of a glass wafer Wg with, for instance, an adhesive, with their centers aligned with each other. The wafers W thus assume a two-layer structure constituted with a glass layer and a silicon layer. A wafer W assuming this structure may be used in, for instance, a CMOS image sensor manufacturing process.

The diameter of the silicon wafer Ws is smaller than the diameter of the glass wafer Wg and thus, the edge L of the glass wafer Wg extends further out beyond the edge of the silicon wafer Ws at the wafer W.

In addition, a notch N, to be used as a notch mark, is formed over an area of the edge of the silicon wafer Ws. It is to be noted that a notch mark constituted with an orientation flat, instead of the notch N may be formed. The wafer W can be positioned along the circumferential direction by detecting this notch N. No notch mark is formed at the edge of the glass wafer Wg for the following reason.

For instance, when manufacturing a CMOS image sensor by using the wafer W, a CMOS device is formed at the silicon wafer Ws with the glass wafer Wg functioning as a sensor support member and a protective layer. For this reason, it is more important to position the silicon wafer Ws accurately than the glass wafer Wg during the manufacturing process. Accordingly, a notch mark should be formed at the edge of the selection wafer Ws*. In addition, while a notch mark may be formed at the edge of the glass wafer Wg in correspondence to the directionality, e.g., the crystal direction, of the silicon wafer Ws, the silicon wafer Ws and the glass wafer Wg will have to be bonded together with a very high level of positional accuracy in this case and thus, the feasibility issue must be cleared. For these reasons, the notch N is formed only at the edge of the silicon wafer Ws at the wafer W.

In addition, the entire edge of the glass wafer Wg is beveled (not shown in FIG. 2). Since light perpendicular to the wafer surface is not allowed to advance linearly over the beveled edge, the edge can be detected with, for instance, a light-transmitting sensor. This point is to be detailed later.

Light emitted from a light emitting unit toward a light receiving unit at a standard light-transmitting sensor normally used in wafer positioning processing (hereafter referred to as "sensor light") has a wavelength that allows the light to be transmitted through a glass layer but does not allow it to be transmitted through a silicon layer. Namely, the silicon layer is a nontransparent layer and the glass layer is a transparent layer for the sensor light.

Since the silicon layer (silicon wafer Ws) constituting the nontransparent layer is formed on top of the glass layer (glass wafer Wg) constituting the transparent layer at the wafer W achieved in the embodiment, the light-transmitting sensor is able to detect the edge of the silicon wafer Ws. However, the light-transmitting sensor is also capable of detecting the beveled edge of the glass wafer Wg, as well as the edge of the silicon wafer Ws.

This leads to a concern that when a light-transmitting sensor is engaged to obtain data indicating the edge shape of a wafer W in the related art constituted with a glass wafer Wg through which the sensor light is transmitted and a silicon wafer Ws through which the sensor light is not transmitted by rotating the wafer W along the circumferential direction, the sensor may detect the edge of the glass wafer Wg or the edge of the silicon wafer Ws depending upon the rotational angle. If the position detected as the edge of the wafer W is not uniform, as in this case, valid the edge shape data cannot be obtained and thus, the wafer W cannot be positioned accurately. In addition, the notch N is formed only at the edge of the silicon wafer Ws at the wafer W. Thus, the notch N cannot easily be detected in the related art, making it substantially impossible to position the wafer W along the circumferential direction.

Accordingly, the positioning device 200 achieved in the embodiment detects only the edge of the silicon wafer Ws with a high level of accuracy at the wafer W constituted with the glass wafer Wg and the silicon wafer Ws, obtains valid data indicating the edge shape of the wafer W based upon the detection results and positions the wafer W based upon these data with a high level of accuracy.

Figure 3:
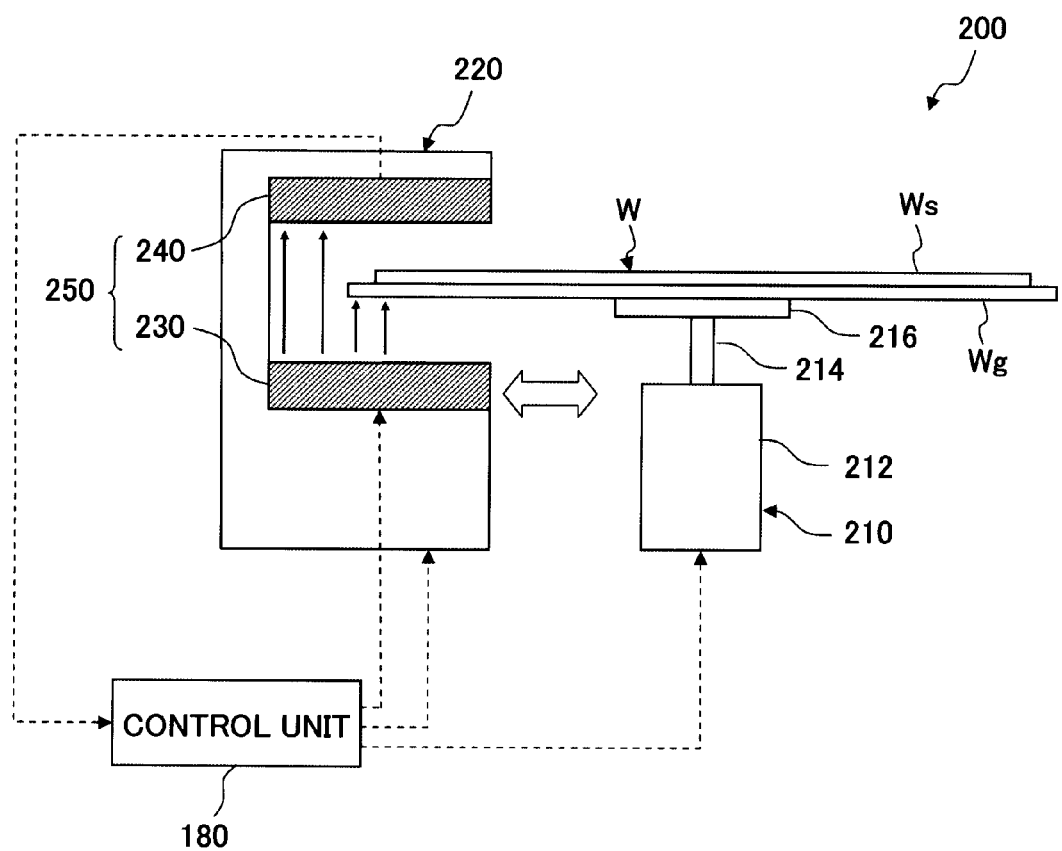
FIG. 3 schematically illustrates a specific structural example that may be adopted in the positioning device in the embodiment.
Figure 4:
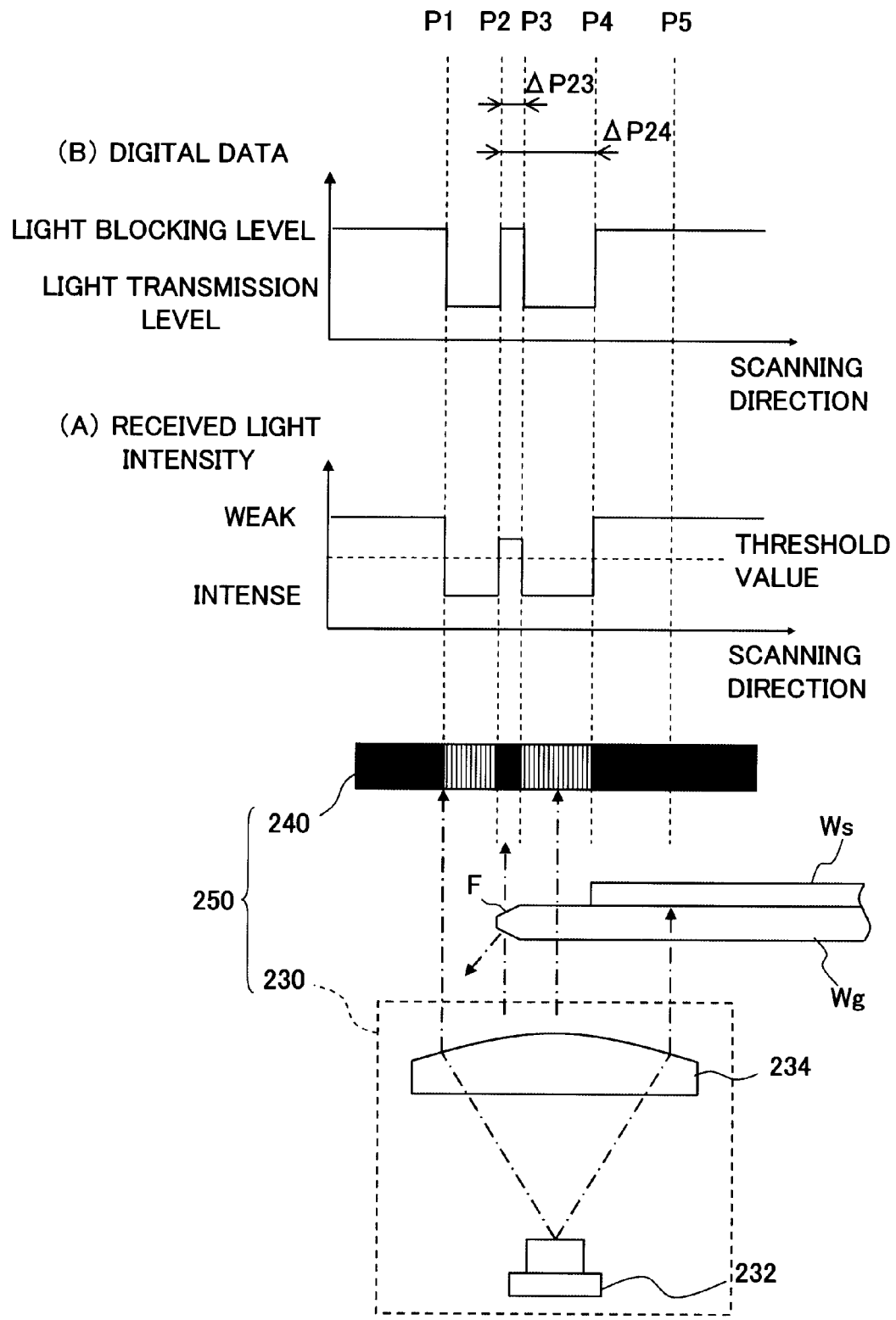
FIG. 4 illustrates the principle based upon which a wafer edge is detected by the positioning device in the embodiment.

Structural Example for the Positioning Device Achieved in the First Embodiment A specific structural example that may be adopted in the positioning device 200 is now explained in reference to drawings. FIG. 3 schematically illustrates an example of a structure that may be adopted in the positioning device 200. FIG. 4 illustrates the principal of the wafer edge detection executed by the positioning device 200 to detect the edge of the silicon wafer Ws constituting the wafer W.

As shown in FIG. 3, the positioning device 200 is constituted by disposing inside a substantially cylindrical container a rotary stage 210 on which the wafer W is placed and a sensor unit 220 that detects the edge of the silicon wafer Ws with a light-transmitting sensor 250.

The rotary stage 210 may include, for instance, a drive unit 212, a rotating drive shaft 214 extending from the drive unit 212 and a rotary plate 216 fixed onto the rotating drive shaft 214, on which the wafer W is placed. The rotary plate 216 is made to rotate by a specific extent by a motive force transmitted by the drive unit 212 via the rotating drive shaft 214. The rotary stage 210 is connected to a control unit 180 and its drive is controlled in response to a control signal provided by the control unit 180. It is to be noted that the wafer W is placed on the rotary stage 210 so that the glass wafer Wg is set in contact with the rotary plate 216.

While the outer diameter of the rotary plate 216 is set smaller than the outer diameter of the wafer W, the rotary plate 216 should still be large enough to fully support the wafer W as it rotates. In addition, a rubber pad or an electrostatic holding pad (not shown) is disposed at the upper surface of the rotary plate 216 so that the wafer W placed on the rotary plate 216 is held fast against the centrifugal force while the rotary plate 216 rotates. It is to be noted that the wafer W electrostatically held onto the rotary plate 216 may include a thin polysilicon film or a thin amorphous silicon film formed over the surface of the glass wafer Wg facing toward the rotary plate 216.

The sensor unit 220 includes the light-transmitting sensor 250, representing an example of a detection means for detecting the edge of the wafer W. The light-transmitting sensor 250 includes a light emitting unit 230 and a light receiving unit 240, which are disposed so as to operate across the edge of the wafer W set on the rotary stage 210. More specifically, the light emitting unit 230 may be disposed so that it assumes a position under the wafer W and the light receiving unit 240 may be disposed so that it assumes a position above the wafer W.

The light emitting unit 230 and the light receiving unit 240 of the light-transmitting sensor 250 are individually connected to the control unit 180. The light emitting unit 230 emits sensor light with a predetermined wavelength toward the light receiving unit 240 with controlled intensity in conformance to a control signal provided by the control unit 180. The light receiving unit 240, in turn, receives the sensor light having been transmitted through an area of the wafer W that includes a wafer edge area, converts information indicating the intensity of the sensor light and the like to a specific signal and transmits the signal to the control unit 180.

The light emitting unit 230 includes a light emitting element 232 such as a light emitting diode and a lens 234 that adjusts the light path of the sensor light emitted by the light emitting element 232 so that it extends perpendicular to the surface of the wafer W. as shown in FIG. 4. A slit (not shown) may be formed above the lens 234 to improve the rectilinear propagation characteristics of light. By improving the linearity of the sensor light in this manner, entry of disturbance light at the light receiving unit 240 attributable to scattering sensor light can be minimized.

The light receiving unit 240 may be constituted with, for instance, a CCD (charge coupled device) linear sensor. A plurality (e.g. 3000 or more) of pixel elements constituting the light receiving unit 240 are linearly disposed starting at a position further outward relative to the edge of the wafer W placed on the rotary plate 216 toward a point further inward relative to the edge of the wafer W. The size of the pixel elements may be, for instance, 14 μm. It is to be noted that the light receiving unit 240 may be constituted with light receiving elements such as photodiodes, instead.

The sensor light having been emitted from the light emitting element 232 of the light emitting unit 230 and having passed through the lens 234 is radiated toward the light receiving unit 240 and is thus received at the light receiving unit 240 at the sensor unit 220 described above. At the light receiving unit 240, the sensor light scans the plurality of linearly disposed pixel elements starting with the pixel element furthest away toward the outside of the wafer W and the light received at the individual pixel elements is sequentially converted to output signals (hereafter may also be referred to as an "analog signal") each constituted with an electrical signal indicating the intensity of the light having been received at a given pixel element. The light receiving unit 240 then transmits the analog signal corresponding to the intensity level of the received light to the control unit 180. This analog signal is graphed in FIG. 4(A). In short, the analog signal as referred to in this context represents a specific example of signals output from the light-receiving pixels and indicates the level of intensity of the sensor light received at the light-receiving pixels, i.e., the received light intensity. Thus, the analog signal may be considered to indicate the received light intensity.

Upon receiving the analog signal from the light receiving unit 240, the control unit 180 compares the analog signal with a preset threshold value separating a "light transmission level" from a "light blocking level" so as to determine whether or not the analog signal indicates the "light transmission level" or the "light blocking level" and generates 2-value digital data indicating the decision results. For instance, the control unit 180 may generate the 2-value digital data by judging that a received light intensity level lower (weaker) than the threshold value is the "nontransparent level" and judging that a light receiving intensity level higher than (more intense than) the threshold value is a "transparent level".

Such digital data are graphed in FIG. 4(B). These digital data are generated in correspondence to each of the pixel elements constituting the light receiving unit 240 at the light-transmitting sensor 250 and thus, a decision can be made based upon the digital data as to whether or not the sensor light has entered the individual pixel elements. More specifically, if the digital data corresponding to a given pixel element indicate the "light transmission level", the particular pixel element can be judged to have received sensor light with an intensity level equal to or higher than the specific level, whereas if the digital data indicate the "light blocking level", the pixel element can be judged to have not received sensor light with an intensity level equal to or greater than the specific level. In other words, the control unit 180 is able to execute positioning processing for the wafer W by detecting a pixel element having received sensor light with an intensity level equal to or higher than the specific level and a pixel element that has not received such sensor light among the plurality of pixel elements and then detecting the boundary position separating these pixel elements.

However, the light receiving unit 240 at the light-transmitting sensor 250 outputs an analog signal indicating a very low received light intensity while scanning a pixel element assuming a position corresponding to the edge of the glass wafer Wg, as well as while scanning a pixel element assuming a position corresponding to the silicon wafer Ws. For this reason, the digital data generated by the control unit 180 indicate the "light blocking level" both in correspondence to the silicon wafer Ws and in correspondence to the edge of the glass wafer Wg.

If these digital data are directly utilized in the positioning processing executed for the wafer W, as in the related art, the control unit 180 may detect both the edge of the glass wafer Wg and the edge of the silicon wafer Ws as the edge of the wafer W. Under such circumstances, since the edge position of the wafer W cannot be univocally determined, the wafer W cannot be positioned accurately. Accordingly, the control unit 180 executes the following data processing on the digital data so as to position the wafer W with high accuracy.

Data Processing Executed by the Control Unit in the First Embodiment

Next, in reference to drawings, the data processing executed by the control unit 180 in the first embodiment is explained. As has already been described in reference to FIG. 4, the control unit 180, having received the analog signal corresponding to the intensity of the light having entered the individual pixel elements at the light receiving unit 240 generates 2-value digital data from the analog signal.

At the light receiving unit 240, the first pixel element through the pixel element assuming the position P1 in the range assumed along the scanning direction are all present outside the sensor light radiation range, and thus, the sensor light does not enter these pixel elements, with the digital data corresponding to these pixel elements indicating the "light blocking level".

Assuming that P2 indicates the position of the edge of the glass wafer Wg, the sensor light advances unhindered over the range between the position P1 and the position P2, i.e., the sensor light directly enters the pixel elements within this range. As a result, the digital data corresponding to these pixel elements indicate the "light transmission level".

As described earlier, the edge of the glass wafer Wg is beveled over the entire circumference of the glass wafer. It is assumed that the range between the edge of the glass wafer Wg and a position P3 has been beveled. Over the beveled area F, the sensor light perpendicular to the wafer surface is mostly refracted and reflected and thus, only very little sensor light enters the pixel elements present over the range between the position P2 and the position P3. Since the intensity of the sensor light is lower than the preset threshold value, the corresponding digital data indicate the "light blocking level".

Assuming that P4 indicates the position of the edge of the silicon wafer Ws, the silicon wafer Ws is not present over the surface of the glass wafer Wg and both the front surface and the rear surface of the glass wafer Wg range perpendicular to the sensor light over an area ranging between the position P3 and the position P4. Accordingly, the sensor light advances linearly within the glass wafer Wg and enters the pixel elements present within this range without having become attenuated to a significant extent. As a result, the corresponding digital data indicate the "light transmission level".

The silicon wafer Ws is present from the position P4 onward along the scanning direction and thus, the sensor light, blocked by the silicon wafer Ws, does not enter the pixel elements present in this range, with the corresponding digital data indicating the "light blocking level".

The control unit 180 achieved in the first embodiment executes data analysis processing as described below after generating the digital data described above. It first targets the pixel elements corresponding to the wafer W among the plurality of pixel elements constituting the light receiving unit 240. The target pixel elements in the example presented in FIG. 4 are the pixel elements set along the scanning direction starting at the position P2. It is to be noted that the control unit may instead target the pixel elements present over the range of the light receiving unit 240 over which the sensor light is received when the wafer W is not present between the light emitting unit 230 and the light receiving unit 240, i.e., the range between the position P1 and a position P5, instead.

Next, a boundary position at which a changeover from the light transmission level to the light blocking level occurs in the digital data along the forward direction in the pixel element array is detected. In the example presented in FIG. 4, the position P2 and the position P4 are each equivalent to the boundary position.

Next, either of the positions P2 and P4 thus detected, beyond which the light blocking level is sustained over a number of pixel elements equal to or greater than a predetermined number of pixels following the level changeover, is selected. The number of pixel elements used as a selection criterion at this point may be the number of pixels equivalent to a distance Δ P24 between the edge of the glass wafer Wg and the edge of the silicon wafer Ws, i.e., the number of pixel elements present within the range between the position P2 and the position P4.

The measurement Δ P23 of the beveled area F at the glass wafer Wg, taken along the wafer diameter, is naturally smaller than the distance Δ P24. Accordingly, by imposing a condition under which the boundary point beyond which the light blocking level is sustained over a number of pixel elements equal to or greater than the number of pixel elements present within the range between the position P2 and the position P4, it is ensured that the position P4, not the position P2 is detected with a high level of reliability. It is to be noted that when the distance Δ P24 is, for instance, approximately 0.4 mm and the size of the pixel elements is 14 μm, the number of pixels used as the selection criterion will be 30.

The control unit 180 then detects the position P4 as the position of the edge of the wafer W. The position P4 thus detected corresponds to the edge of the silicon wafer Ws as shown in FIG. 4.

As described above, the edge of the silicon wafer Ws at the wafer W can be exclusively and accurately detected through the data analysis processing executed by the control unit 180 in the first embodiment. The control unit 180 receives the analog signal corresponding to the received light intensity from the light-transmitting sensor 250 by rotating the wafer W via the rotary plate 216 and then executes the data analysis processing on the analog signal to collect position information indicating the position of the edge over the entire circumference of the silicon wafer Ws. As a result, the shape of the circumference of the silicon wafer Ws at which the notch N is formed can be ascertained and ultimately, the wafer W can be positioned with a high level of accuracy.

Wafer Edge Shape Data Obtained by the Control Unit in the First Embodiment

Figure 5:
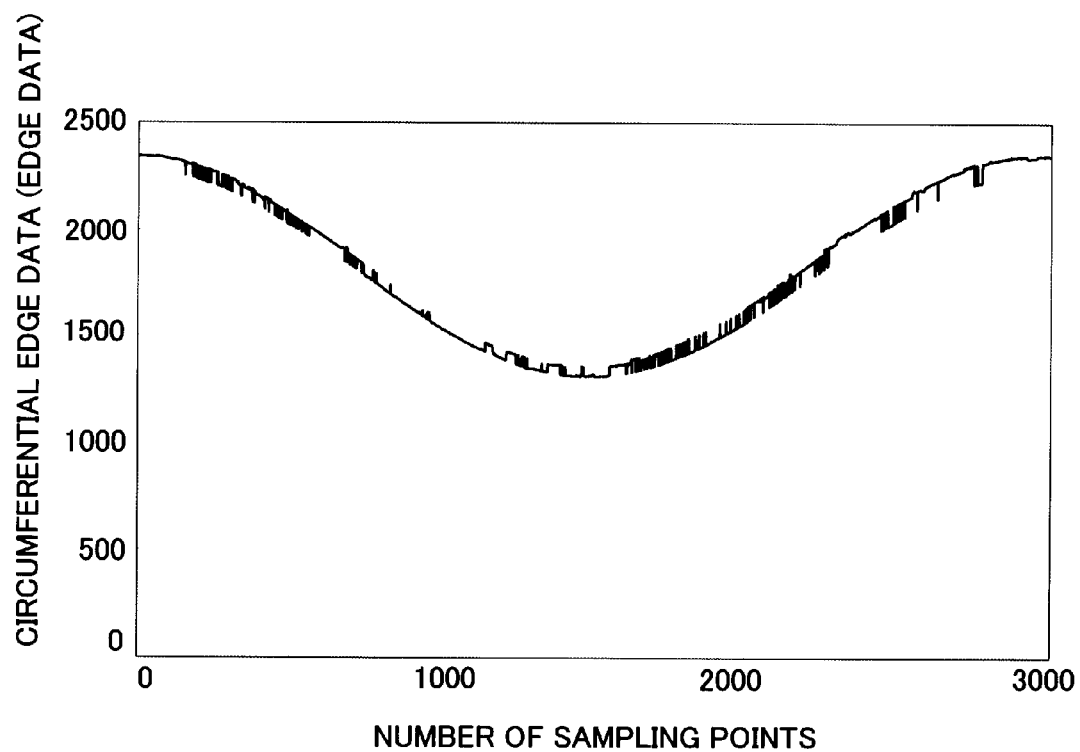
FIG. 5 presents a graph of wafer edge shape data obtained by adopting a technology in the related art.
Figure 6:
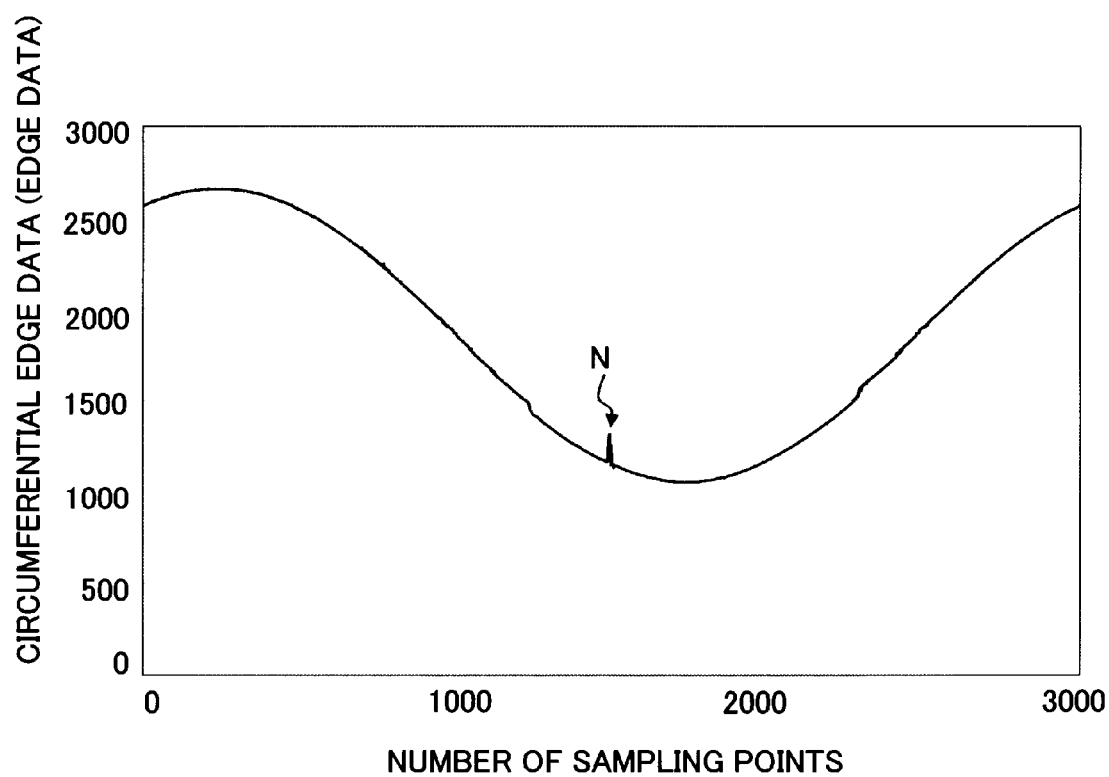
FIG. 6 presents a graph of wafer edge shape data obtained in the embodiment.

Next, the wafer edge shape data obtained through the data analysis processing executed by the control unit 180 in the first embodiment, as described above, are explained in reference to FIGS. 5 and 6. FIG. 5 shows edge shape data pertaining to the wafer W, which are obtained by detecting the edge of the wafer W while rotating a wafer W as in the related art without the control unit 180 executing the data analysis processing in the first embodiment on the digital data. FIG. 6, on the other hand, shows the edge shape data pertaining to a wafer W, obtained by detecting only the edge of the silicon wafer Ws as the edge of the wafer W while rotating the wafer W in conjunction with the data analysis processing in the embodiment executed by the control unit 180. In the graphs presented in FIGS. 5 and 6, the number of sampling points (correspond to the rotational angles assumed by the wafer W) is indicated along the horizontal axis and the position information indicating the position (e.g., the address) of the pixel element detected by the control unit 180 at the edge of the wafer W among the plurality of pixel elements constituting the light receiving unit 240 is indicated along the vertical axis.

The edge shape data for the wafer W in both FIGS. 5 and 6 are represented by a substantially sine curve instead of a straight line extending parallel to the horizontal axis, since the edge of the wafer W is detected while it is rotated in a state in which the center of the wafer W is not accurately aligned with the rotational center of the rotary stage 210. The control unit 180 uses the edge shape data represented by this curve to calculate the direction and the extent of misalignment between the center of the wafer W and the rotational center of the rotary stage 210 and then, based upon the calculation results, determines the position of the center of the wafer W.

If the control unit 180 does not execute the data analysis processing in the first embodiment, as in the example presented in FIG. 5, the edge of the glass wafer Wg or the edge of the silicon wafer Ws may be selected as the edge of the wafer W depending upon the rotational angle of the wafer W. Under such circumstances, noise is superimposed over the edge shape data for the wafer W and, as a result, the control unit 180 cannot accurately determine the center of the wafer W. In addition, the position of the notch N formed at the edge of the silicon wafer Ws cannot be ascertained accurately based upon such edge shape data, disabling positioning processing for positioning the wafer W along the circumferential direction as well.

If, on the other hand, it is ensured that only the edge of the silicon wafer Ws is detected as the edge of the wafer W through the data analysis processing in the first embodiment executed by the control unit 180, noise-free, clear edge shape data for the wafer W (more specifically, edge shape data for the silicon wafer Ws) can be obtained, as shown in FIG. 6. As a result, the control unit 180 is able to determine the position of the center of the wafer W with a high level of accuracy. In addition, since the position of the notch N can be verified accurately by using the edge shape data, the wafer W can be positioned along the circumferential direction with a high level of accuracy as well.

Data Processing Executed by the Control Unit in a Second Embodiment

Next, the data processing executed by the control unit 180 in the second embodiment is explained in reference to a drawing. In the first embodiment, the control unit 180 having received the analog signal corresponding to the intensity of light having entered each pixel element at the light-receiving unit 240, generates 2-value digital data based upon the analog signal and then executes a specific type of analysis processing on the digital data so as to detect only the edge of the silicon wafer Ws as the edge of the wafer W.

The control unit 180 executes data processing so as not to reflect the position information indicating the position of the edge of the glass wafer Wg on the digital data when converting the analog signal received from the light receiving unit 240 to 2-value data.

Figure 7:
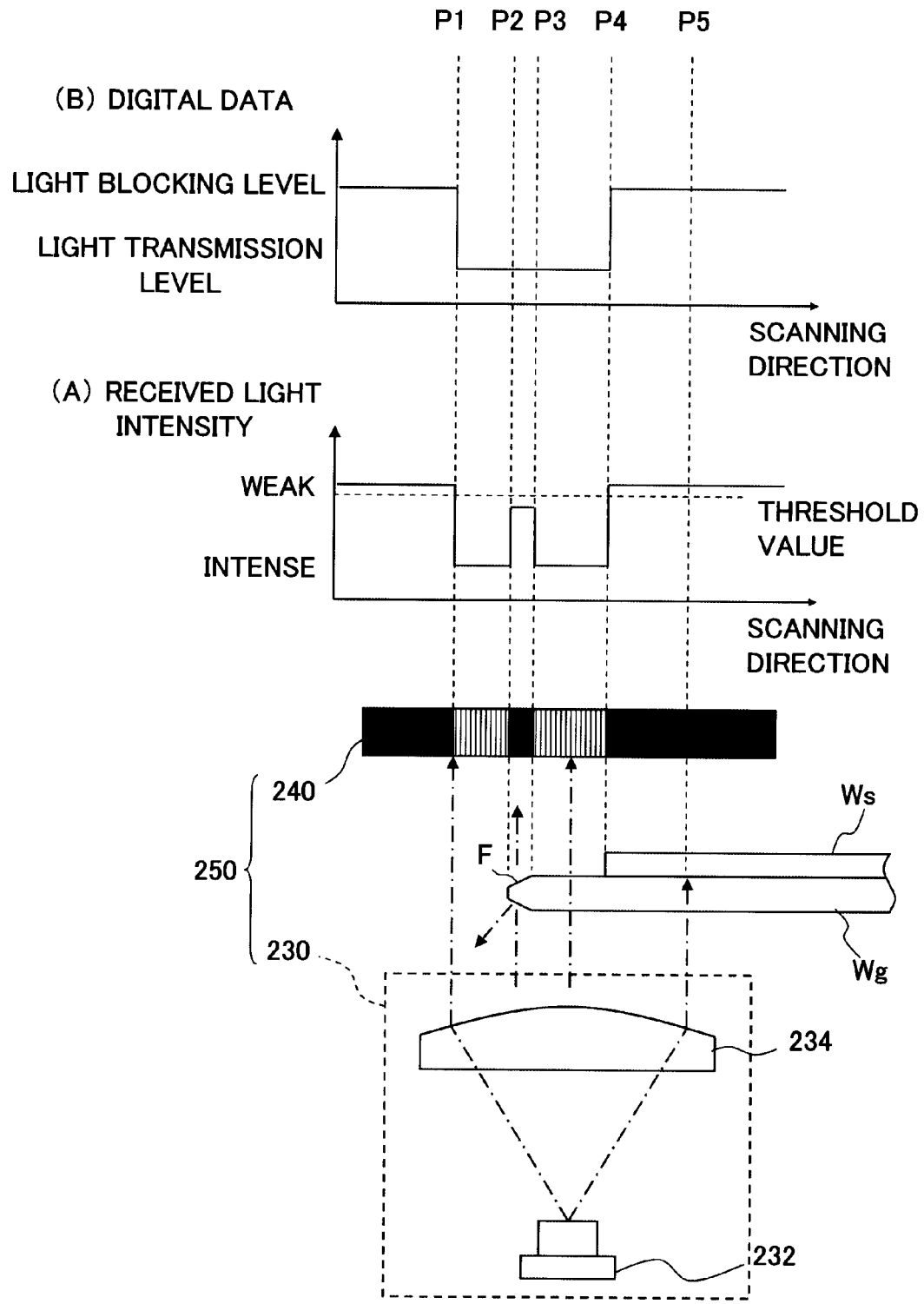
FIG. 7 illustrates the principle based upon which a wafer edge is detected by the positioning device in a second embodiment of the present invention.

More specifically, the threshold value used when converting the analog signal to 2-value data is set to a level lower than the intensity of sensor light reaching the light-receiving means 240 after having been transmitted through the beveled area F formed at the edge of the glass wafer Wg, as shown in FIG. 7. In the embodiment, the threshold value assumes a value between the received light intensity corresponding to the beveled area F at the glass wafer Wg and the received light intensity corresponding to the area over which the silicon wafer Ws is present. This means that a received light intensity level lower (weaker) than the threshold value is judged to be a "nontransparent level", whereas a received light intensity level higher (more intense) than the threshold value is judged to be a "transparent level". Accordingly, a signal corresponding to the intensity of the sensor light reaching the light-receiving means 240 after having been transmitted through the beveled area F of the glass wafer Wg, indicating a light intensity level higher (more intense) than the threshold value, is invariably judged to indicate the "light transmission level".

By selecting a threshold value at which the signal output from the pixel element having received sensor light transmitted through the edge of the glass wafer Wg is judged to indicate the light transmission level as described above, the digital data corresponding to the range between the position P2 and the position P3 are set to the "light transmission level". It is desirable that such a threshold value be selected in advance by measuring the intensity of the sensor light transmitted through the beveled area F a plurality of times.

As explained earlier, the sensor light advancing perpendicular to the wafer surface is mostly refracted and reflected at the beveled area F, resulting in a very small quantity of sensor light entering the pixel elements present in the range between the position P2 and the position P3. Accordingly, the digital data corresponding to this range will indicate the "light blocking level" in conjunction with the threshold value used in the related art. The threshold value is intentionally lowered in the second embodiment so as to ensure that the digital data corresponding to the beveled area F, i.e., the range between the positions P2 and P3, indicate the "light transmission level" as do the digital data corresponding to the range over which the rest of the glass wafer Wg excluding the beveled area F is present, i.e., the range between the position P3 and P4.

The digital data obtained as described above indicate the "light blocking level" only over the range between the positions P4 and P5 among the various ranges assumed between positions P1 and P5. These digital data are substantially identical to digital data that would be obtained by detecting the edge of a wafer constituted entirely with a silicon wafer Ws via a light-transmitting sensor.

Consequently, digital data reflecting the position information indicating the position of the edge of the silicon wafer Ws alone are obtained via the control unit 180 in the second embodiment. The control unit 180 is then able to ascertain the shape of the edge of the silicon wafer Ws based upon the digital data. This, in turn, enables the control unit 180 to position the wafer W with a high level of accuracy.

The quantity of light transmitted through the beveled area F at the glass wafer Wg may change as the state of the wafer W changes. Under such circumstances, a changeover from the "light transmission level" to the "light blocking level" may occur in the digital data corresponding to the beveled area F, i.e., the range between the positions P2 and P3. This issue may be effectively addressed by combining the data processing in the second embodiment with the data processing in the first embodiment. Through the combination processing, the edge of the silicon wafer Ws alone can be detected with a high level of reliability as the edge of the wafer W without detecting the edge of the glass wafer Wg.

Data Processing Executed by the Control Unit in a Third Embodiment

Next, the data processing executed by the control unit 180 in the third embodiment is explained in reference to a drawing. In the first and second embodiments, the control unit 180 having received the analog signal from the light receiving unit 240 generates digital data by converting the analog signal to 2-value data and then executes a specific type of analysis processing on the digital data so as to detect only the edge of the silicon wafer Ws as the edge of the wafer W. The control unit 180 in the third embodiment analyzes the digital data through an alternative method and detects only the edge of the silicon wafer Ws as the edge of the wafer W. The following is an explanation of the data analysis executed by the control unit 180 in the third embodiment, given in reference to FIG. 4.

The control unit 180 in the third embodiment executes the following data analysis processing after generating the digital data shown in FIG. 4 based upon the analog signal received from the light receiving unit 240. It first targets the pixel elements corresponding to the wafer W among the plurality of pixel elements constituting the light receiving unit 240. The target pixel elements in the example presented in FIG. 4 are the pixel elements set along the scanning direction starting at the position P2.

Next, a boundary position at which a changeover from the light transmission level to the light blocking level occurs in the digital data along the forward direction in the pixel element array is detected. In the example presented in FIG. 4, the position P2 and the position P4 are each equivalent to the boundary position.

The control unit 180 then selects the second position P4 along the forward pixel element arraying direction among the positions P2 and P4 having been detected. The selected position P4 corresponds to the edge of the silicon wafer Ws as shown in FIG. 4.

The control unit 180 may detect the edge of the silicon wafer Ws alone as the edge of the wafer W by analyzing the digital data through yet another method. More specifically, it may select the first position P4 along the reverse direction in the pixel element array among the positions P2 and P4 having been detected. The selected position P4 corresponds to the edge of the silicon wafer Ws as shown in FIG. 4.

As described above, the edge of the silicon wafer Ws at the wafer W can be exclusively and accurately detected as the edge of the wafer W by the control unit 180 in the third embodiment, as in the first and second embodiments. The control unit 180 receives the analog signal corresponding to the received light intensity from the light-transmitting sensor 250 by rotating the wafer W via the rotary plate 216 and then executes the data analysis processing on the analog signal to collect position information indicating the position of the edge over the entire circumference of the silicon wafer Ws. As a result, the shape of the circumference of the silicon wafer Ws at which the notch N is formed can be ascertained and ultimately, the wafer W can be positioned with a high level of accuracy.

The wafer positioning processing achieved in any of the embodiments may be adopted in conjunction with a wafer with an orientation flat formed therein to be used as a notch mark, as well as a wafer with a notch N formed therein to be used as a notch mark.

In addition, while an explanation is given above in reference to the embodiments in which the present invention is adopted in conjunction with a wafer W formed by bonding a glass wafer Wg and a silicon wafer Ws one on top of the other, the present invention is not limited to this example and it may be adopted in conjunction with any of various types of substrates constituted with a transparent layer with a high level of light transmissivity and a nontransparent layer with a low level of light transmissivity.

Furthermore, it is obvious that the present invention may be achieved by providing a system or an apparatus with a medium such as a storage medium having stored therein a software program enabling the functions of the embodiments (e.g., the data analysis processing function an the wafer positioning processing function) and by reading out and executing the program stored in the medium via the computer (a CPU or MPU) of the system or the apparatus.

In such a case, the program itself read out from the medium such as a storage medium embodies the functions of the embodiments described above and the medium such as a storage medium having the program stored therein embodies the present invention. The medium such as a storage medium through which the program is provided may be, for instance, a floppy (registered trademark) disk, a hard disk, an optical disk, a magneto-optical disk, a CD-ROM, a CD-R, a CD-RW, a DVD-ROM, a DVD-RAM, a DVD-RW, a DVD+RW, magnetic tape, a nonvolatile memory card, or a ROM. Alternatively, such a program may be obtained through distribution via a network.

It is to be noted that the scope of the present invention includes an application in which an OS or the like operating on the computer executes the actual processing in part or in whole in response to the instructions in the program read out by the computer and the functions of the embodiments are achieved through the processing thus executed, as well as an application in which the functions of the embodiment are achieved as the computer executes the program it has read out.

The scope of the present invention further includes an application in which the program read out from the medium such as a storage medium is first written into a memory in a function expansion board loaded in the computer or a function expansion unit connected to the computer, a CPU or the like in the function expansion board or the function expansion unit executes the actual processing in part or in whole in response to the instructions in the program and the functions of the embodiments described above are achieved through the processing.

While the invention has been particularly shown and described with respect to a preferred embodiment thereof by referring to the attached drawings, the present invention is not limited to these examples and it will be understood by those skilled in the art that various changes in form and detail may be made therein without departing from the spirit, scope and teaching of the invention.

What is claimed is:

1. A substrate positioning device which positions a substrate having a two-layer structure, the two-layer structure includes a transparent layer with a high level of light transmissivity and a nontransparent layer with a low level of light transmissivity having smaller external dimensions than said transparent layer, the transparent layer and the nontransparent layer are superposed one on top of the other so that an edge of said transparent layer extends along an entire periphery beyond an edge of said nontransparent layer, comprising:

a stage on which said substrate is placed;

a light emitting means for emitting light toward said substrate on said stage by directing the light toward the edge of said substrate including the edge of said transparent layer and the edge of said nontransparent layer;

a light-receiving means disposed to face opposite said light emitting means with said substrate set in between, which includes a plurality of light-receiving pixels linearly arrayed from a point further outside relative to the edge of said substrate toward a point further inside relative to the edge of said substrate and outputs signals each corresponding to the intensity of light received at one of said light-receiving pixels; and a control unit that compares the signals output from said light-receiving means with a preset threshold value to determine whether the output signal from each light-receiving pixel indicates a light transmission level or a light blocking level, then detects a boundary at which a changeover from said light transmission level to said light blocking level occurs along a forward direction in the array of the sequentially disposed light-receiving pixels as the edge position of said nontransparent layer only if said light blocking level following said changeover is judged to be sustained over a number of light-receiving pixels equal to or greater than a distance between the edge of said transparent layer and the edge of said nontransparent layer, wherein only the edge position of said nontransparent layer over the entire periphery of said substrate, not the edge of said transparent layer, is exclusively detected and said substrate is positioned based upon the edge that is detected.

2. A substrate positioning device according to claim 1, wherein:

said threshold value is set in advance to a value at which a signal output from a light-receiving pixel having received light transmitted through the edge of said transparent layer is judged to indicate said light transmission level.

3. A substrate positioning device according to claim 1, wherein:

said transparent layer is constituted with a glass substrate and said nontransparent layer is constituted with a silicon substrate.

4. A substrate positioning device according to claim 1, wherein:

a notch mark formed at the edge of said nontransparent layer is detected based upon the edge shape of said nontransparent layer ascertained by detecting the nontransparent layer edge position over the entire periphery of said substrate and said substrate is positioned based upon said detected notch mark.

5. A substrate positioning device which positions a substrate having a two-layer structure, the two-layer structure includes a transparent layer with a high level of light transmissivity and a nontransparent layer with a low level of light transmissivity having smaller external dimensions than said transparent layer, the transparent layer and the nontransparent layer are superposed one on top of the other so that an edge of said transparent layer extends along an entire periphery beyond an edge of said nontransparent layer, comprising:

a rotary stage on which said substrate is placed;

a light emitting means for emitting light toward said substrate on said stage by directing the light toward the edge of said substrate including the edge of said transparent layer and the edge of said nontransparent layer;

a light-receiving means disposed to face opposite said light emitting means with said substrate set in between, which includes a plurality of light-receiving pixels linearly arrayed from a point further outside relative to the edge of said substrate toward a point further inside relative to the edge of said substrate and outputs signals each corresponding to the intensity of light received at one of said light-receiving pixels; and a control unit that compares the signals output from said light-receiving means with a preset threshold value assuming a value at which a signal output from a light-receiving pixel having received light transmitted through the edge of said transparent layer is judged to indicate a light transmission level to determine whether the output signal from each light-receiving pixel indicates said light transmission level or a light blocking level, then detects a boundary at which a changeover from said light transmission level to said light blocking level occurs along a forward direction in the array of the sequentially disposed light-receiving pixels, detects a position of a light-receiving pixel present at said boundary as the edge position of said nontransparent layer only if said light blocking level following said changeover is judged to be sustained over a number of light-receiving pixels equal to or greater than a distance between the edge of said transparent layer and the edge of said nontransparent layer, wherein only the edge of said nontransparent layer over the entire circumference of the substrate, not the edge of said transparent layer, is exclusively detected and said substrate is positioned based upon the edge that is detected.

6. A substrate positioning method adopted in a substrate processing device to position a substrate having a two-layer structure, the method comprising:

superposing a transparent layer with a high level of light transmissivity and a nontransparent layer with a low level of light transmissivity, which has smaller external dimensions than said transparent layer, one on top of the other so that an edge of said transparent layer extends over an entire periphery beyond an edge of said nontransparent layer, said substrate positioning device comprises:

a stage on which said substrate is placed;

a light emitting means for emitting light toward said substrate on said stage by directing the light toward the edge of said substrate including the edge of said transparent layer and the edge of said nontransparent layer; and a light-receiving means disposed to face opposite said light emitting means with said substrate set in between, which includes a plurality of light-receiving pixels linearly arrayed from a point further outside relative to the edge of said substrate toward a point further inside relative to the edge of said substrate and outputs signals each corresponding to the intensity of light received at one of said light-receiving pixels;

comparing signals output from said light-receiving means with a preset threshold value to determine whether the output signal from each light-receiving pixel indicates a light transmission level or a light blocking level, a boundary at which a changeover from said light transmission level to said light blocking level occurs along a forward direction in the array of said sequentially disposed light-receiving pixels is detected, a position of a light-receiving pixel present at said boundary is exclusively detected as the edge position of said nontransparent layer only if said light blocking level following said changeover is judged to be sustained over a number of light-receiving pixels equal to or greater than a distance between the edge of said transparent layer and the edge of said nontransparent layer;

detecting only the edge position of said nontransparent layer over the entire periphery of the substrate without detecting the edge of said transparent layer; and positioning said substrate based upon the edge detection results.

7. A substrate positioning method according to claim 6, further comprising:

setting said threshold value in advance to a value at which a signal output from a light-receiving pixel having received light transmitted through the edge of said transparent layer is judged to indicate said light transmission level.

8. A substrate positioning method according to claim 6, wherein:

said transparent layer is constituted with a glass substrate and said nontransparent layer is constituted with a silicon substrate.

9. A substrate positioning method according to claim 6, wherein:

a notch mark formed at the edge of said nontransparent layer is detected based upon the edge shape of said nontransparent layer ascertained by detecting the position of the edge of said nontransparent layer over the entire periphery of said substrate and said substrate is positioned based upon said notch mark having been detected.

10. A substrate positioning method adopted in a substrate processing device to position a substrate having a two-layer structure, the method comprising:

superposing a transparent layer with a high level of light transmissivity and a nontransparent layer with a low level of light transmissivity, that has smaller external dimensions than said transparent layer, one on top of the other so that an edge of said transparent layer extends over an entire periphery beyond an edge of said nontransparent layer, the substrate positioning device includes:

a rotary stage on which said substrate is placed;

a light emitting means for emitting light toward said substrate on said rotary stage by directing the light toward the edge of said substrate including the edge of said transparent layer and the edge of said nontransparent layer; and a light-receiving means disposed to face opposite said light emitting means with said substrate set in between, which includes a plurality of light-receiving pixels linearly arrayed from a point further outside relative to the edge of said substrate toward a point further inside relative to the edge of said substrate and outputs signals each corresponding to the intensity of light received at one of said light-receiving pixels;

comparing the signals output from said light-receiving means with a preset threshold value assuming a value at which a signal output from a light-receiving pixel having received light transmitted through the edge of said transparent layer is judged to indicate a light transmission level to determine whether the output signal from each light-receiving pixel indicates a light transmission level or a light blocking level, a boundary at which a changeover from said light transmission level to said light blocking level occurs along a forward direction in the array of the sequentially disposed light-receiving pixels is detected, a position of a light-receiving pixel present at said boundary is detected exclusively as the edge position of said nontransparent layer only if said light blocking level following said changeover is judged to be sustained over a number of light-receiving pixels equal to or greater than a distance between the edge of said transparent layer and the edge of said nontransparent layer;

detecting only the edge position of said nontransparent layer over the entire periphery of the substrate without detecting the edge of said transparent layer; and positioning said substrate based upon the edge detection results.

* * * * *